US011614470B2

(12) United States Patent
Craig (10) Patent No.: US 11,614,470 B2
(45) Date of Patent: Mar. 28, 2023

(54) NON-INVASIVE CURRENT SENSING DEVICE

(71) Applicant: U-Haul International, Inc., Phoenix, AZ (US)

(72) Inventor: William Craig, Gilbert, AZ (US)

(73) Assignee: U-HAUL INTERNATIONAL, INC., Phoenix, AZ (US)

( * ) Notice: Subject to any disclaimer, the term of this patent is extended or adjusted under 35 U.S.C. 154(b) by 0 days.

(21) Appl. No.: 17/453,597

(22) Filed: Nov. 4, 2021

(65) Prior Publication Data

US 2022/0137099 A1 May 5, 2022

Related U.S. Application Data

(60) Provisional application No. 63/109,982, filed on Nov. 5, 2020.

(51) Int. Cl.
*G01R 1/067* (2006.01)
*G01R 15/20* (2006.01)
*G01R 19/00* (2006.01)
*G01R 1/04* (2006.01)

(52) U.S. Cl.
CPC ........... *G01R 15/202* (2013.01); *G01R 1/04* (2013.01); *G01R 1/06788* (2013.01); *G01R 19/0092* (2013.01)

(58) Field of Classification Search
CPC ...... G01R 15/202; G01R 15/207; G01R 1/04; G01R 1/06788; G01R 19/0092
See application file for complete search history.

(56) References Cited

U.S. PATENT DOCUMENTS

| 4,378,525 | A | 3/1983 | Burdick |
|---|---|---|---|
| 4,704,575 | A | 11/1987 | Arnoux et al. |
| 4,737,710 | A | 4/1988 | Van Antwerp et al. |
| 6,252,389 | B1 | 6/2001 | Baba et al. |
| 7,327,133 | B2 | 2/2008 | Baker et al. |
| 7,439,726 | B2 * | 10/2008 | Luo ..................... G01R 1/06788 324/149 |
| 7,746,055 | B2 * | 6/2010 | Bose .................... G01R 15/202 324/126 |

(Continued)

FOREIGN PATENT DOCUMENTS

EP 2233933 11/2012

*Primary Examiner* — Dominic E Hawkins
(74) *Attorney, Agent, or Firm* — Richard E. Oney; Venjuris, P.C.

(57) ABSTRACT

A current sensing device includes a housing with a head adapted for releasably holding a wire of an electrical circuit without breaking the electrical circuit. The head has one or more current sensors configured to sense direct current in the wire without breaking the electrical circuit. The housing includes an alarm to indicate if the current sensing device senses a current in the electrical wire above a predefined threshold current. The head has a clip base and clip member that form an internal channel to closely receive the electrical wire and to releasably hold the electrical wire for testing. In some embodiments, the head has an internal channel that intersects the outer surface of the head and forms a longitudinal opening to allow insertion of the wire into the internal channel. The current sensing device has a processor programed to calibrate the current sensing device to compensate for electrical noise.

9 Claims, 7 Drawing Sheets

(56) References Cited

U.S. PATENT DOCUMENTS

| | | | |
|---|---|---|---|
| 8,330,449 B2 | 12/2012 | Greenberg | |
| 9,063,184 B2 * | 6/2015 | Carpenter | G01R 33/02 |
| 2010/0090683 A1 * | 4/2010 | Bose | G01R 15/202 |
| | | | 324/117 H |
| 2016/0011239 A1 * | 1/2016 | Yoon | G01R 15/20 |
| | | | 324/126 |
| 2016/0091535 A1 * | 3/2016 | Bannister | G01R 15/125 |
| | | | 324/127 |
| 2017/0003320 A1 | 1/2017 | Tsujimoto | |

* cited by examiner

NON-INVASIVE CURRENT SENSING DEVICE

BACKGROUND

This invention relates generally to current sensing devices. More specifically, it relates to a current sensing device that can be used to detect current in a wire of a vehicle wiring harness in a non-invasive manner.

In certain situations, it becomes necessary to determine which wire of a vehicle wiring harness conducts the electrical current to control specific vehicle functions. Such situations arise when a technician is trying to analyze, diagnose or repair a vehicle wiring harness. For example, installing a trailer lighting plug connector on a vehicle requires the installer to identify which of the wires in the vehicle wiring harness conduct the current for controlling the brake and turn-signal tail lamp functions. Traditionally, the installer does this by having a second person activate the vehicle brake or turn signal while the installer uses a current meter to measure whether a selected wire in the wiring harness conducts current in response to such activation. This method, however, requires the installer to understand the circuit of the wire being tested and to either cut the harness wire or remove a harness plug to insert the meter into the circuit.

Another method for determining whether the selected wire is conducting current is to use a meter with a piercing probe that perforates the insulation of the wire to measure its voltage when the brake/turn signal is activated. Such probes, however, can cause damage to the harness wire, which can be costly to repair.

As another alternative, a clamp meter can be used to measure current within a selected wire provided that there is sufficient space between the wires of the harness to allow the selected wire to be positioned within the jaws of the clamp meter without involving the other wires of the harness. One example of such a meter is the Fluke 325 True RMS clamp meter, which is an inductive meter that includes a clamp with two articulated jaws that can be opened and closed to form a closed loop around a wire for sensing current in the wire. Although such meters do not require that the wire be cut or pierced, they are expensive and are relatively complex to operate, and require the end user to interpret readings on the meter. Typically, using such a meter for determining which wire within a wiring harness provides current to a vehicle's rear brake and signal lights requires two people, i.e., one person to actuate the brake pedal to activate the brake lamps and, because the meter provides no audible signal, a second person to read the display on the meter.

It is an object of the present invention to provide a non-invasive current sensor that can be used to detect which wires in a wiring harness are conducting current without unplugging the connector or damaging the harness wires.

It is another object of the present invention to provide such a current sensor that is easy to use and can be operated by a single person to determine which wires in a wiring harness control particular tail lamp functions while operating the driver controls of a vehicle.

It is still another object of the present invention to provide such a current sensor that is easier to use and less expensive to produce than existing clamp meters.

Additional objects and advantages of the invention will be set forth in the description that follows, and in part will be apparent from the description, or may be learned by practice of the invention. The objects and advantages of the invention may be realized and obtained by means of the instrumentalities and combinations pointed out in the appended claims.

SUMMARY

To achieve the foregoing objects, and in accordance with the purposes of the invention as embodied and broadly described in this document, there is provided a current sensing device for sensing direct current in an electrical conductor of an electrical circuit. The current sensing device includes a housing with a head adapted for releasably holding a wire of the electrical circuit without breaking the electrical circuit. The current sensing device also has one or more current sensors disposed within the head and configured to sense direct current in the wire without breaking the electrical circuit. The housing can include an alarm to indicate if the current sensing device senses a current in the electrical wire above a predefined threshold current. The housing can have a processor programed to calibrate the current sensing device to compensate for electrical noise. The processor can be programed to automatically calculate a running average of sample readings from the one or more current sensors and to use the result of that calculation to determine whether a subsequent reading from the one or more current sensors exceeds a threshold current value.

In some embodiments, the head includes a clip base and an opposing clip member flexibly attached to the clip base, and the clip base and clip member are configured to form an internal channel to closely receive the electrical wire and to releasably hold the electrical wire. The clip member can include a directional indicator to show which direction the electrical wire should be oriented within the internal channel for testing. The clip member can be normally biased into a closed position and can be temporarily lifted to an open position to insert the electrical wire into the internal channel or remove the electrical wire from the internal channel. A distal end of the clip member can be slightly away from the clip base to facilitate sliding the electrical wire between the clip member and the clip base.

In other embodiments, the head includes an outer surface and an internal channel sized for receiving the wire. The internal channel intersects the outer surface of the head and forms a longitudinal opening configured to allow insertion of the wire into the internal channel. The longitudinal opening includes at least one curved portion adapted to retain the wire within the internal channel.

The current sensing device of the invention can detect the presence of direct current in a wire in a non-invasive manner, then provide a yes/no or on/off indication (such as an audible tone, light, and/or other signal) to the user when the measured current exceeds a given threshold. The device can be used to easily detect which wires in a vehicle body wiring harness control particular tail lamp functions without unplugging the connector. The invention eliminates the need for an end user to interpret readings on a current meter, or to pierce or cut a wire or remove a plug in order to use a traditional current meter. A sole person can use the current sensing device to detect current while operating the driver controls of a vehicle.

BRIEF DESCRIPTION OF THE DRAWINGS

The accompanying drawings, which are incorporated in and constitute a part of the specification, illustrate the presently preferred embodiments of the invention and, together with the general description given above and the detailed description of the preferred methods and embodiments given below, serve to explain the principles of the invention.

DETAILED DESCRIPTION

Reference will now be made in more detail to presently preferred embodiments of the invention, as illustrated in the accompanying drawings. While the invention is described more fully with reference to these examples and drawings, the invention in its broader aspects is not limited to the specific details, representative devices, and illustrative examples shown and described. Rather, the description, which follows is to be understood as a broad, teaching disclosure directed to persons of ordinary skill in the appropriate arts, and not as limiting upon the invention.

It will be appreciated that terms such as "forward," "rearward," "upper," "inner," "outer," "vertical," "horizontal," "bottom," "below," "top," "side," "inwardly," "outwardly," "downwardly," "lower," "proximal," "distal" and other positional descriptive terms used in this specification are used merely for ease of description and refer to the orientation of the referenced components as shown in the figures. It should be understood that any orientation of the components described herein is within the scope of the present invention.

Figure 1:
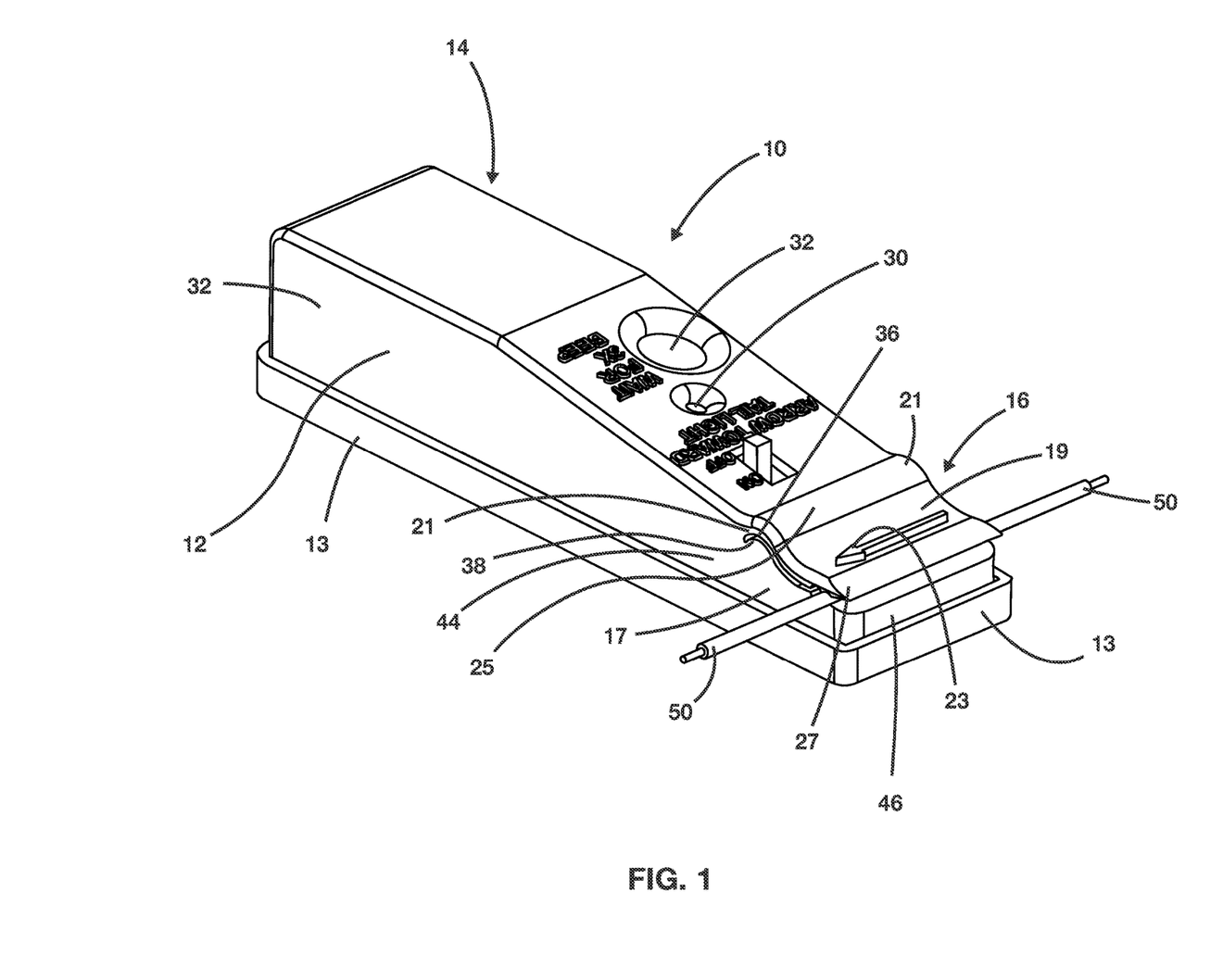
FIG. 1 is a perspective view of one embodiment of a current sensing device according to the present invention showing an electrically conducting wire being held within the internal channel of the sensing device head.
Figure 2:
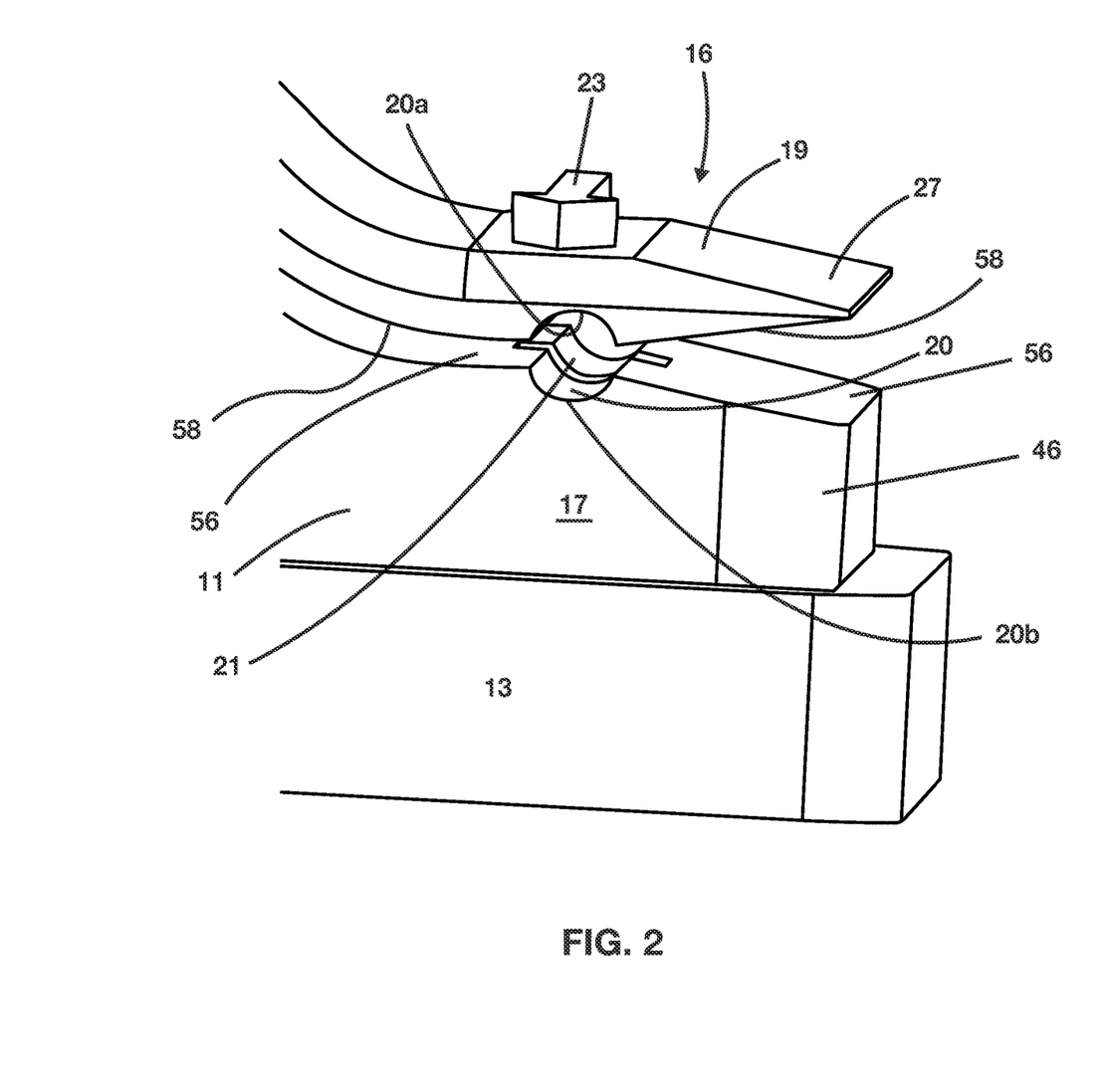
FIG. 2 is an enlarged side elevation view of the head of the current sensing device of FIG. 1.

In the drawings, the reference numeral 10 designates a current sensing device in accordance with the invention. Referring to FIGS. 1-2, one embodiment of the current sensing device 10 includes a housing 12 that has a housing body 11 and a removable housing base 13. The housing 12 includes a proximal handle portion 14 and a distal head 16 adapted for releasably holding an electrical wire 50. The head 16 includes a clip base 17 and an opposing clip member 19 configured to form an internal channel 20 sized for closely receiving the wire 50. The housing body 11 is made from a rigid insulating material. The housing body 11 (including the clip base 17 and the clip member 19) can be included as part of a unitary construction, which can be inexpensively injection molded as one piece. In some exemplary embodiments, the housing body 11 (including the clip base 17 and clip member 19) can be made of a thermoset or a rigid thermoplastic material having a hardness from about 40 to 90 on the Shore D hardness scale, such as ABS or polyethylene material. The housing base 13 can be made of a flexible material having a hardness of about 30 to 70 on the Shore A hardness scale, such as a polyurethane or silicone material.

The clip member 19 has a proximal end 25 that is flexibly joined to the clip base 17 and a distal end 27 that is biased toward the clip base 17. The distal end 23 is positioned in sufficient proximity to the clip base 17 to accommodate the insulated wire 50 without overextending the clip member 19 when it is lifted to an open position as described below. The biasing force is adequately supplied by the intrinsic resilience of the materials used in manufacture of the clip base 17 and the clip member 19, combined with the general angulation of the clip member 19 towards the clip base 17. Alternatively, a spring may be utilized in other embodiments to provide the biasing force. The clip member 19 has a bottom surface 58 with a side profile that includes a concave channel curve 20a defining an upper portion of the internal channel 20 and a concave proximal curve 36 at the clip member proximal end 25. The clip base 17 has a top surface 56 that opposes the clip member bottom surface 58. A slot 21 is provided in the clip base top surface 56 for holding a current sensor 26. The clip base top surface 56 has a side profile that includes a concave channel curve 20b defining a lower portion of the internal channel 20 and a convex proximal curve 38 at the clip base proximal end 44, which corresponds to the shape of the concave proximal curve 36 the clip member bottom surface 58. The internal channel 20 is of sufficient diameter to accommodate the size of the wire 50 and clamp the wire 50 that is being tested when the clip member 19 is displaced by the wire 50. In one exemplary embodiment of the current sensing device 10 shown in FIGS. 1-2, the internal channel 20 has a diameter of about 0.1 inch.

Still referring to FIGS. 1-2, the concave proximal curve 36 facilitates flexing of the clip member 19 without reaching its elastic limit. The convex proximal curve 38 acts as a chamfer to manage the stress concentration produced by the lever arm of the clip member 19. In this configuration, the clip member 19 is normally biased into a closed position (see FIG. 1) but can be temporarily lifted to an open position (see FIG. 2) to insert a wire 50 for testing. The clip member distal end 27 angles slightly away from the clip base 17 to facilitate sliding the conducting wire 50 between the clip member 19 and the clip base 17 for sensing current in the wire 50. The clip member also has a directional arrow 23 to indicate to a user which direction the current sensing device 10 should be oriented for testing, e.g., which side of the current sensing device should be oriented toward the tail light of the vehicle in which the wire harness is installed.

Figure 6:
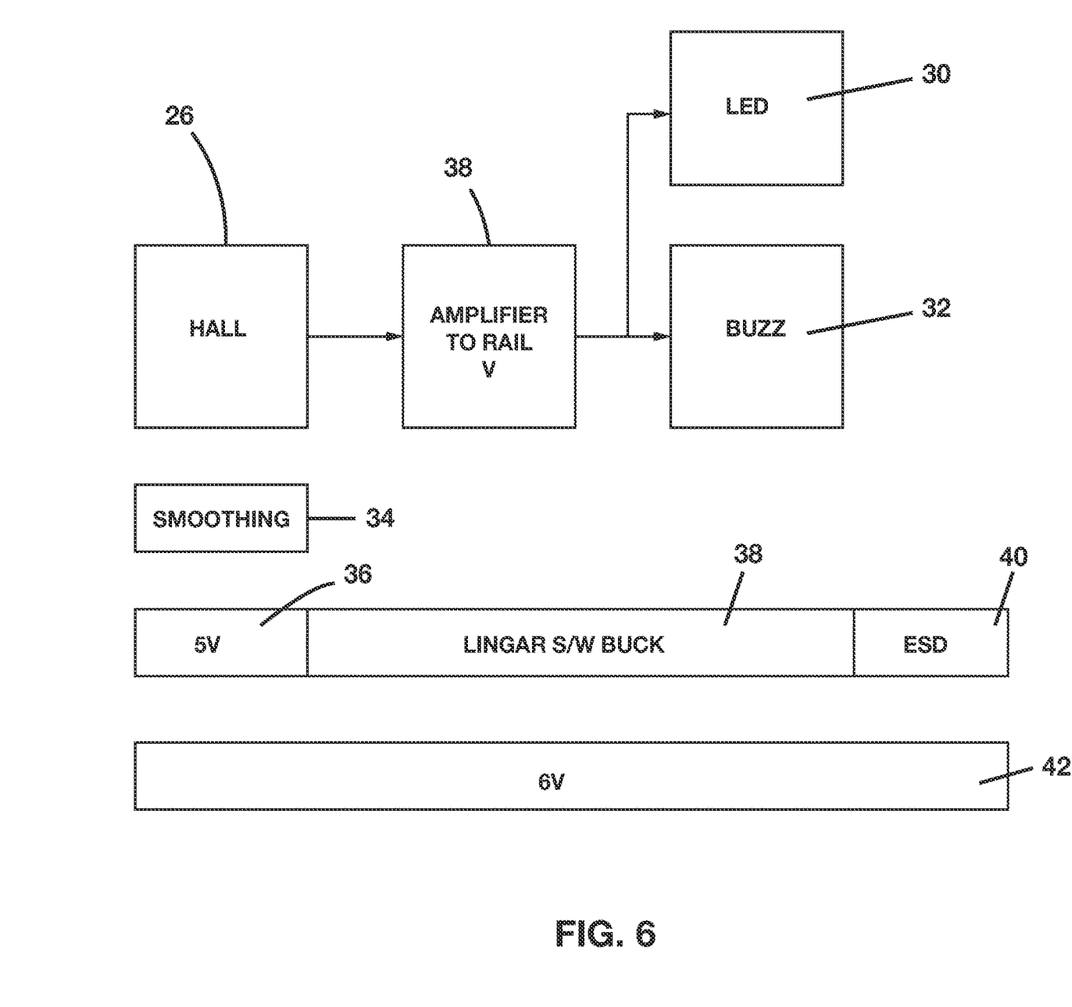
FIG. 6 is a block diagram of components of one embodiment of a current sensing device according to the present invention.

Referring to FIG. 6, the current sensing device 10 also includes an electrical circuit designed to measure direct currents. The electrical circuit is housed within the housing (which can include the handle portion 14 and the head 16). The electrical circuit includes one or more current sensors 26 housed within the head 16 along the internal channel 20 and configured to sense direct current in the wire 50 without breaking the electrical circuit. In some embodiments, the current sensors 26 comprise Hall-effect sensors in TO-92 packages. An amplifier (which can include a field-effect-transistor or operational amplifier) amplifies the output of the Hall-effect sensor 26 to drive an on/off indication or alarm (such as an LED 30 or buzzer 32) to provide an audible tone, light, and/or other signal indicating when the current sensing device senses a threshold current in the wire 50. In some embodiments, the electrical circuit can include a smoothing filter 34 that comprises a low-pass filter designed to filter out ambient noise induced in the sensor's signal wire. The smoothing filter 34 can be implemented digitally in software and can provide filtering in real-time as magnetic flux measurements are read from the current sensors. An ESD protection device/circuit 40 provides protection from Electro-Static Discharge. The current sensing device 10 is powered by a rechargeable battery 42, which can power a switch-mode power supply 38. A micro-USB port can be provided on the housing 12, such as at the base of the handle portion 14, for charging a rechargeable battery 42 and programming the microcontroller described below. In some embodiments, power can be provided by a battery (such as a 9-volt battery) and a low-dropout (LDO) regulator.

Figure 7:
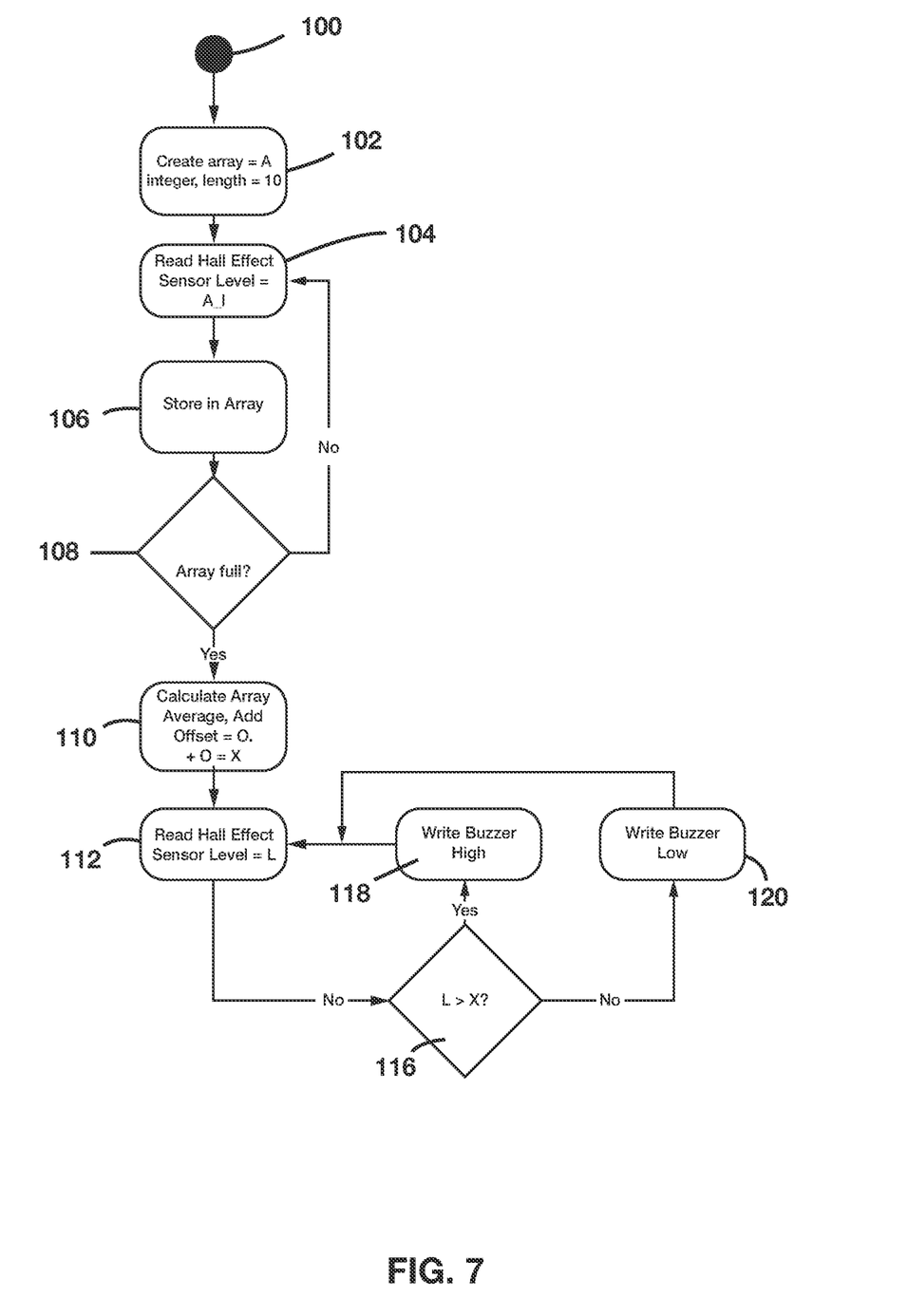
FIG. 7 is an activity diagram depicting one exemplary calibration process that can be implemented via a microcontroller for calibrating the current sensing device to compensate for electrical noise.

The current sensing device 10 also includes a microcontroller (not shown) for calibrating the current sensing device 10 to compensate for electrical noise. The microcontroller can be, for example, a PIC microcontroller or an ATTiny microcontroller. FIG. 7 shows an activity diagram for one exemplary process for such calibration, which involves calculating a running average of 10 sample readings of the current sensor and applying the result of that calculation as an offset for compensating for electrical noise. Referring to FIG. 7, at the start of the process (step 100) an array is created for storing the sample current sensor readings taken during initialization of the device (step 102). After the current sensor level is read (step 104), the reading value is stored in the array (step 106) and a determination is made whether the array is full (step 108). If the array is not full (step 106), then steps 104-108 are repeated. At step 108, if the array is full, the average A of the stored array values is calculated and added to an offset O to determine a threshold current value X (step 110). The offset O is empirically predetermined based on the specific device hardware and is added to the calculated average A. One exemplary offset O is 0.002% of the analog voltage output of the current sensor 26 measurement. After the threshold current value X is calculated during the initialization in step 110, a current sensor reading level L is taken (step 112). The process then determines whether the sensor reading level L is above the threshold current value X (step 116). If it is, the current indicator (i.e., LED 30 and/or buzzer 32) is activated (step 118) and the process returns to step 112. If at step 116, the sensor reading level L is below the threshold current value X, the current indicator 30, 32 is not activated and the process returns to step 112.

Figure 3:
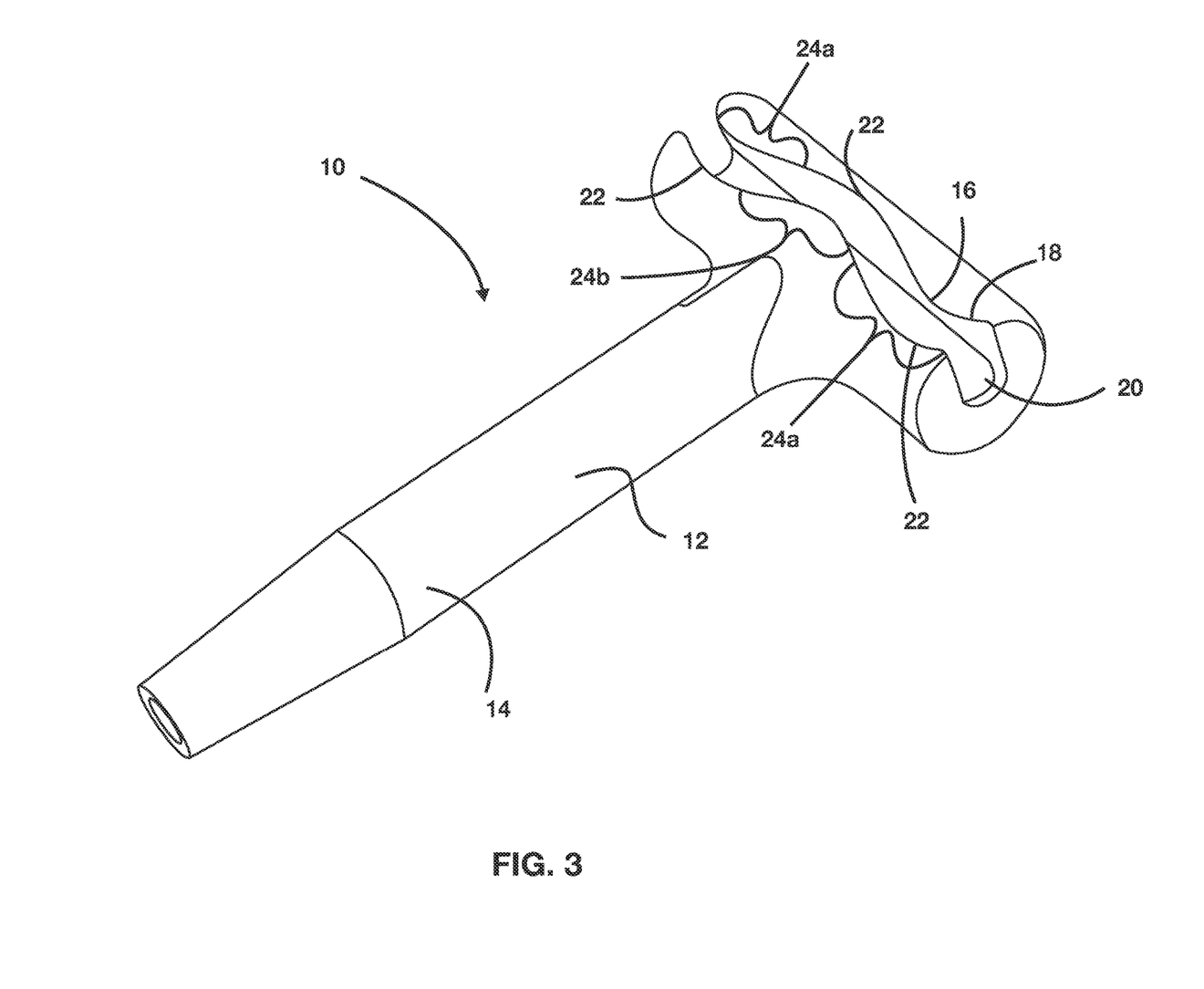
FIG. 3 is a perspective view of an alternative embodiment of a current sensing device according to the present invention.
Figure 4:
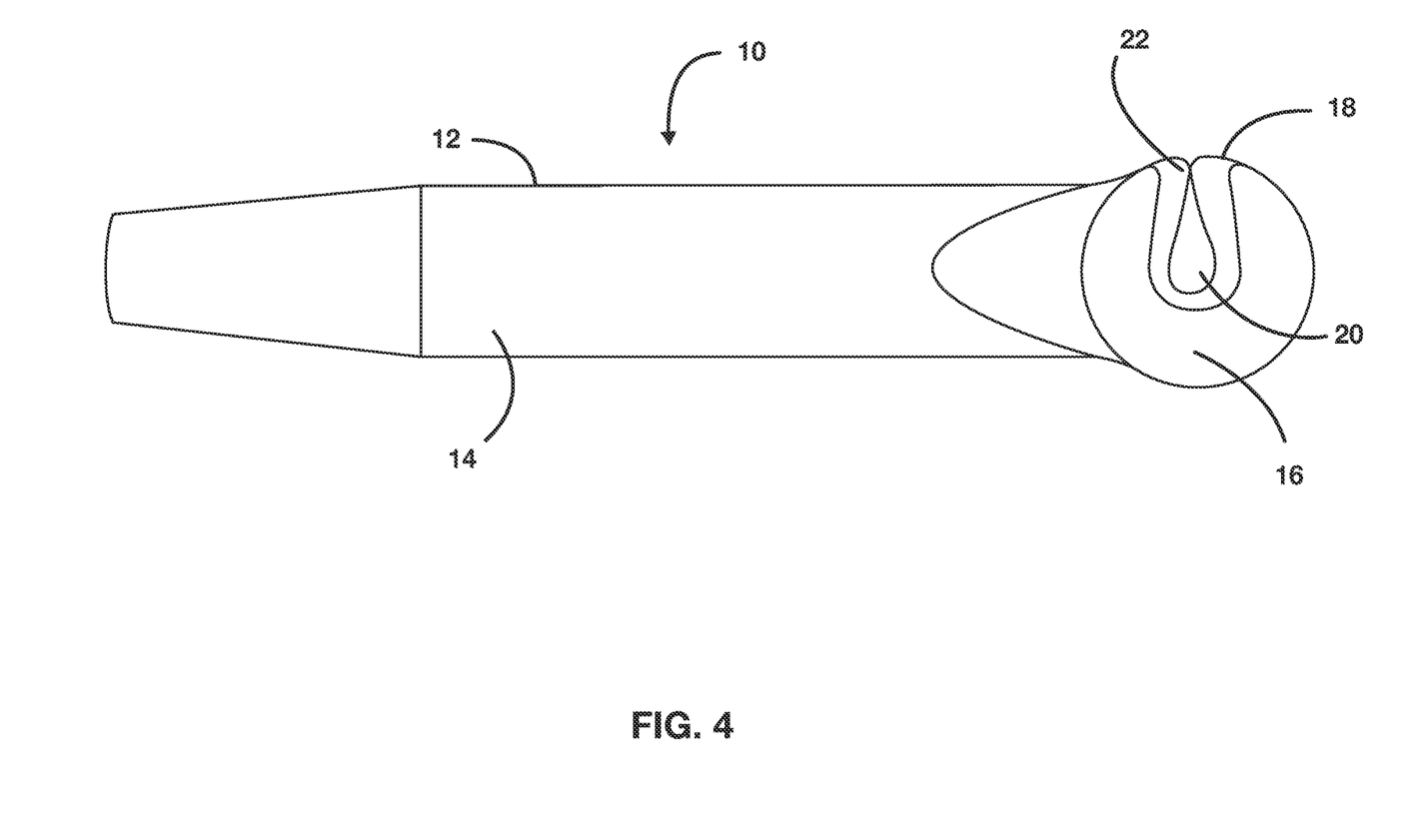
FIG. 4 is a side elevation view of the current sensing device of FIG. 3.
Figure 5:
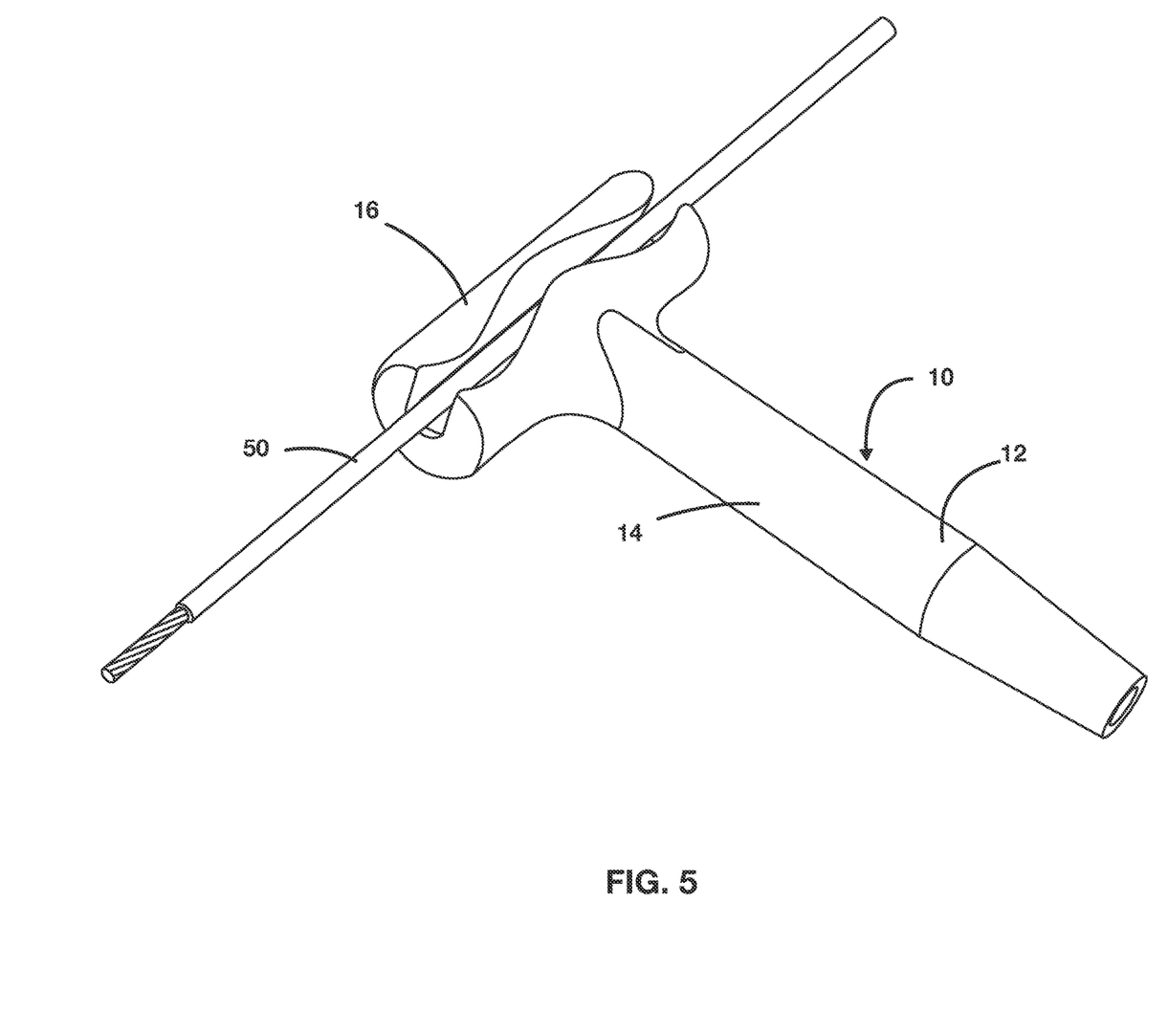
FIG. 5 is a perspective view of the current sensing device of FIG. 3 showing an electrically conducting wire being held within the internal channel of the sensing device head.

Referring to FIGS. 3-5, in some embodiments of the current sensing device 10 the head 16 is elongated and includes an outer surface 18 and an internal channel 20 sized for receiving the wire 50. The internal channel 20 intersects the head outer surface 18 and forms a longitudinal opening 22 configured to allow insertion of the wire 50 into the internal channel 20 by slightly bending portions of the wire 50. The longitudinal opening 22 includes one or more curved portions 24a and an opposing curved portion 24b, which retain the wire 50 within the internal channel 20 (see FIG. 3).

Having read this disclosure, it will also be understood by those having skill in the art that the current sensing device of the present invention enjoys a number of advantages over the prior art. For example, the current sensing device of the invention can detect the presence of direct current in a wire above a given threshold in a non-invasive manner. The device can be used to easily detect which wires in a vehicle body wiring harness control particular tail lamp functions without unplugging the connector. The device eliminates the need for an end user to interpret readings on a Hall-effect current meter, or to cut a wire or remove a plug in order to use a traditional current meter. Also, one person can use the current sensing device to detect current while operating the driver controls of a vehicle.

Upon reading this disclosure, those skilled in the art will appreciate that various changes and modifications may be made to the preferred embodiments of the invention and that such changes and modifications may be made without departing from the spirit of the invention. Therefore, the invention in its broader aspects is not limited to the specific details, representative devices, and illustrative examples shown and described. Accordingly, departures may be made from such details without departing from the spirit or scope of the general inventive concept.

What is claimed is:

1. A current sensing device for sensing direct current in an electrical conductor of an electrical circuit, the current sensing device comprising:
   a housing including a head adapted for releasably holding a wire of the electrical circuit without breaking the electrical circuit;
   one or more current sensors disposed within the head and configured to sense direct current in the wire without breaking the electrical circuit; and
   a processor programmed to calibrate the current sensing device to compensate for electrical noise;
   wherein the head includes a clip base and an opposing clip member flexibly attached to the clip base;
   wherein the clip base and clip member are configured to form an internal channel sized to closely receive and to releasably hold the electrical wire; and
   wherein the processor programmed to calibrate the current sensing device to compensate for electrical noise is programmed to automatically calculate a running average of sample readings from the one or more current sensors and to use the result of that calculation to determine whether a subsequent reading from the one or more current sensors exceeds a threshold current value.

2. The current sensing device of claim 1 wherein the housing includes a directional indicator to show which direction the electrical wire should be oriented within the internal channel for sensing direct current.

3. The current sensing device of claim 1 wherein the housing includes an alarm indicating if the current sensing device senses a current in the electrical wire above a predefined threshold current.

4. The current sensing device of claim 1 wherein the internal channel has a diameter of about 0.1 inch.

5. The current sensing device of claim 1 wherein the clip member is normally biased into a closed position and can be temporarily lifted to an open position to insert the electrical wire into the internal channel or to remove the electrical wire from the internal channel.

6. The current sensing device of claim 1 wherein a distal end of the clip member angles away from the clip base to facilitate sliding the electrical wire between the clip member and the clip base.

7. A current sensing device for sensing direct current in an electrical conductor of an electrical circuit, the current sensing device comprising:
   a housing including a elongated head adapted for releasably holding an electrically conducting wire;
   at least one current sensor disposed within the head and configured to sense direct current in the wire without breaking the electrical circuit; and
   a processor programmed to calibrate the current sensing device to compensate for electrical noise;

wherein the head includes an outer surface and an internal channel sized for receiving the wire;

wherein the internal channel intersects the outer surface of the head and forms a longitudinal opening configured to allow insertion of the wire into the internal channel;

wherein the longitudinal opening includes at least one curved portion adapted to retain the wire within the internal channel; and wherein the processor programmed to calibrate the current sensing device to compensate for electrical noise is programmed to automatically calculate a running average of sample readings from the at least one current sensor and to use the result of that calculation to determine whether a subsequent reading from the at least one current sensor exceeds a threshold current value.

8. The current sensing device of claim 7 wherein the housing includes a directional indicator to show which direction the electrical wire should be oriented within the internal channel for sensing direct current in the electrical wire.

9. The current sensing device of claim 7 wherein the housing includes an alarm indicating if the current sensing device senses a current in the electrical wire above a predefined threshold current.

* * * * *